United States Patent
Funabashi et al.

(10) Patent No.: US 10,630,292 B1
(45) Date of Patent: Apr. 21, 2020

(54) NOISE CANCELLING CIRCUIT AND DATA TRANSMISSION CIRCUIT

(71) Applicant: PANASONIC INTELLECTUAL PROPERTY MANAGEMENT CO., LTD., Osaka (JP)

(72) Inventors: Masami Funabashi, Osaka (JP); Syuji Kato, Osaka (JP); Akinori Shinmyo, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/700,970

(22) Filed: Dec. 2, 2019

Related U.S. Application Data

(63) Continuation of application No. PCT/JP2018/015786, filed on Apr. 17, 2018.

(30) Foreign Application Priority Data

Jun. 29, 2017 (JP) .................................. 2017-128101

(51) Int. Cl.
*H03K 19/003* (2006.01)
*H03K 17/16* (2006.01)
*H03M 9/00* (2006.01)
*H04L 7/00* (2006.01)

(52) U.S. Cl.
CPC ....... *H03K 19/00346* (2013.01); *H03K 17/16* (2013.01); *H03M 9/00* (2013.01); *H04L 7/0008* (2013.01)

(58) Field of Classification Search
CPC .............. H03K 19/00346; H03K 17/16; H04L 7/0008; H03M 9/00
See application file for complete search history.

(56) References Cited

U.S. PATENT DOCUMENTS

| | | | |
|---|---|---|---|
| 2005/0242841 A1 | 11/2005 | Mitsuishi | |
| 2008/0222443 A1* | 9/2008 | Wallner | H03M 9/00 713/502 |
| 2009/0195272 A1* | 8/2009 | Okuzono | G09G 3/20 327/141 |

FOREIGN PATENT DOCUMENTS

JP 4464189 B2 5/2010

OTHER PUBLICATIONS

International Search Report and Written Opinion dated Jul. 3, 2018 in International Patent Application No. PCT/JP2018/015786; with partial English translation.

* cited by examiner

*Primary Examiner* — Daniel D Chang
(74) *Attorney, Agent, or Firm* — McDermott Will & Emery LLP

(57) ABSTRACT

A noise cancelling circuit includes: a first parallel-serial conversion circuit which converts inputted 2N-bit parallel data into serial data; an inverting circuit which inverts one of odd-numbered bits and even-numbered bits included in the inputted 2N-bit parallel data; a second parallel-serial conversion circuit which converts, into serial data, parallel data outputted by the inverting circuit and parallel data of the other one of the odd-numbered bits and the even-numbered bits included in the inputted 2N-bit parallel data which were not inverted; a first buffer which receives output data of the first parallel-serial conversion circuit; and a second buffer which receives output data of the second parallel-serial conversion circuit.

12 Claims, 12 Drawing Sheets

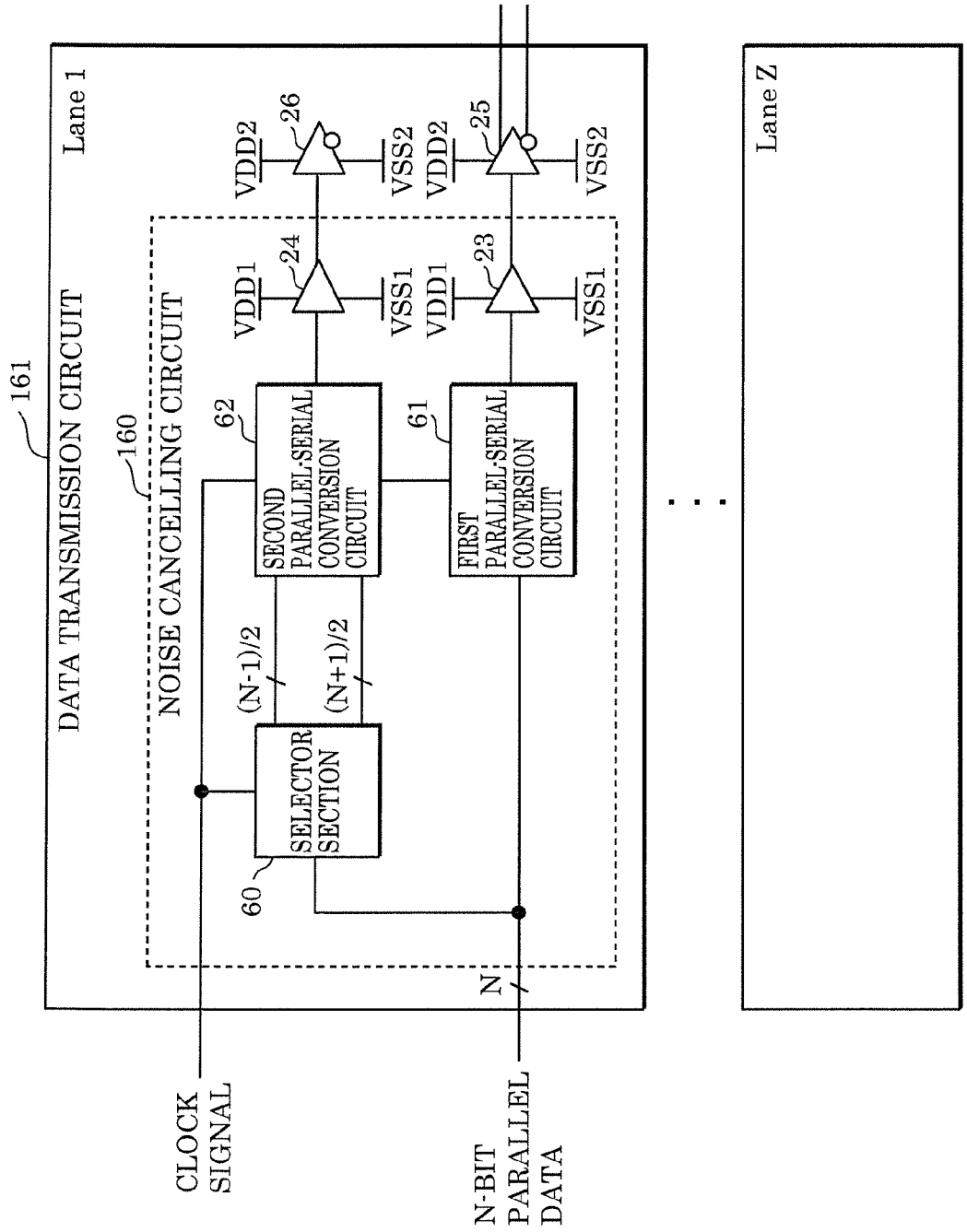

NOISE CANCELLING CIRCUIT AND DATA TRANSMISSION CIRCUIT

CROSS REFERENCE TO RELATED APPLICATIONS

This application is a U.S. continuation application of PCT International Patent Application Number PCT/JP2018/015786 filed on Apr. 17, 2018, claiming the benefit of priority of Japanese Patent Application Number 2017-128101 filed on Jun. 29, 2017, the entire contents of which are hereby incorporated by reference.

BACKGROUND

1. Technical Field

The present disclosure relates to a noise cancelling circuit and a data transmission circuit and more specifically to a technology of suppressing power source noise generated in circuits including a parallel-serial conversion circuit.

2. Description of the Related Art

In response to demands resulting from an increase in data communication capacity handled between electronic devices in recent years, it is required to increase the data communication speed and perform multi-levelling of transmitted signals. Jitter is one of factors contributing to signal quality deterioration in high-speed data transmission. Power source noise is known to be a main factor contributing to deterioration in the jitter characteristics. The power source noise is generated by fluctuation in an instantaneous current flowing at time at which a plurality of logic circuits, buffer circuits, etc. in a transmission circuit simultaneously fluctuate.

Data to be communicated may change continuously in some cases and data may not change while continuing the same values in some cases. When no data change occurs, the volume of an instantaneous current flowing is smaller than when any data change occurs, thus leading to fluctuation in a wave-shaped cycle of the current noise depending on the pattern of data to be communicated.

The magnitude of the power source noise is determined by a product of the value of the instantaneous current and the power source impedance at time of data change. The current source impedance is usually designed to have a resonance point between several MHz to several hundreds of MHz. It is known that where a peak value of the instantaneous current is constantly the same, the power source noise increases when a frequency component of current noise generated by the instantaneous current has a frequency close to the resonance point and the power source noise relatively generated decreases when the current noise is generated at a frequency higher than the resonance point.

Measures for reducing the power source noise have conventionally been practiced by, for example, shifting the timing of simultaneous change for each data to reduce a peak current value of the instantaneous current flowing between a power source and a ground or arranging a large number of bypass capacitors between the power source and the ground. However, with an increase in the communication speed, the instantaneous current value increases, also resulting in failure to provide a sufficient timing margin for shifting the data timing, which in turn leads to great difficulty in suppressing the instantaneous current itself. Therefore, it is difficult to sufficiently suppress the power source noise when a frequency of the current noise of a large instantaneous current changes to a frequency near a resonance point.

Thus, Patent Literature (PTL) 1 provides a noise cancelling circuit which generates a continuous signal when communication data continuously changes and which generates a signal with variable data when data including continuous pieces of communication data is outputted, which drives, by a noise cancelling signal, the same kind of load connected to the same power source as a power source of a communication data path, and in which an instantaneous current is regularly generated regardless of a pattern of the communication data as a result of a change made in the noise cancelling signal when the communication data does not change. The instantaneous current changes in the same cycle as the cycle of the data communication speed, and thus the fluctuation frequency of the instantaneous current moves to a high frequency side and is also kept at a constant frequency, which makes it possible to effectively suppress the power source noise with optimum design of power source impedance.

CITATION LIST

Patent Literature

PTL 1: Japanese Patent No. 4464189

SUMMARY

However, with the noise cancelling circuit of PTL 1, the noise cancelling signal is generated by use of data already subjected to parallel-serial conversion and a clock signal for driving the parallel-serial conversion circuit. Such a configuration faces a problem that the degree of difficulty in timing designing of the noise cancelling circuit by use of the clock signal and a flip-flop circuit dramatically increases with an increase in the data communication speed.

In view of the problem described above, the present disclosure has been made and it is an object of the disclosure to provide, for example, a noise cancelling circuit capable of easily generating a noise cancelling signal even with a higher operation speed.

To address the problem described above, a noise cancelling circuit according to one aspect of the present disclosure includes: a first parallel-serial conversion circuit which converts 2N-bit parallel data into serial data in synchronization with a clock signal, where N is a natural number of 1 or more; an inverting circuit which inverts one of odd-numbered bits and even-numbered bits included in the 2N-bit parallel data; a second parallel-serial conversion circuit which converts, into serial data in synchronization with the clock signal, parallel data outputted by the inverting circuit and parallel data of the other one of the odd-numbered bits and the even-numbered bits included in the 2N-bit parallel data which were not inverted; a first buffer which receives output data of the first parallel-serial conversion circuit; and a second buffer which receives output data of the second parallel-serial conversion circuit, wherein the first parallel-serial conversion circuit and the second parallel-serial conversion circuit are formed using substantially a same kind of circuit, the first buffer and the second buffer are formed using substantially a same kind of circuit, and the first buffer and the second buffer are connected to a common power source and connected to a common ground.

To address the problem described above, a data transmission circuit according to another aspect of the present disclosure includes: the noise cancelling circuit described above; a third buffer which is connected to an output terminal of the first buffer included in the noise cancelling circuit and which outputs a differential signal; and a fourth buffer which is connected to an output terminal of the second buffer included in the noise cancelling circuit and which is formed using substantially a same kind of circuit as a circuit of the third buffer.

ADVANTAGEOUS EFFECTS OF THE DISCLOSURE

With the present disclosure, it is possible to provide, for example, a noise cancelling circuit capable of easily generating a noise cancelling signal even with a higher operation speed.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 10A is a diagram illustrating a configuration of a data transmission circuit according to Embodiment 6;

DETAILED DESCRIPTION OF THE EMBODIMENTS

Hereinafter, noise cancelling circuits and data transmission circuits according to the embodiments of the present disclosure will be described with reference to the drawings. Note that each of the embodiments described below illustrates one detailed example of the present disclosure. Therefore, numerical values, shapes, materials, components, arrangement positions of the components, connection modes, etc. as well as steps, a sequence of the steps, etc. form one example and are not intended to limit the present disclosure in any manner. Moreover, each of the drawings does not necessarily provide precise illustration. Components with substantially the same configurations in each of the figures will be provided with the same numerals and overlapping description of the aforementioned components will be omitted or simplified.

Embodiment 1

Figure 1:
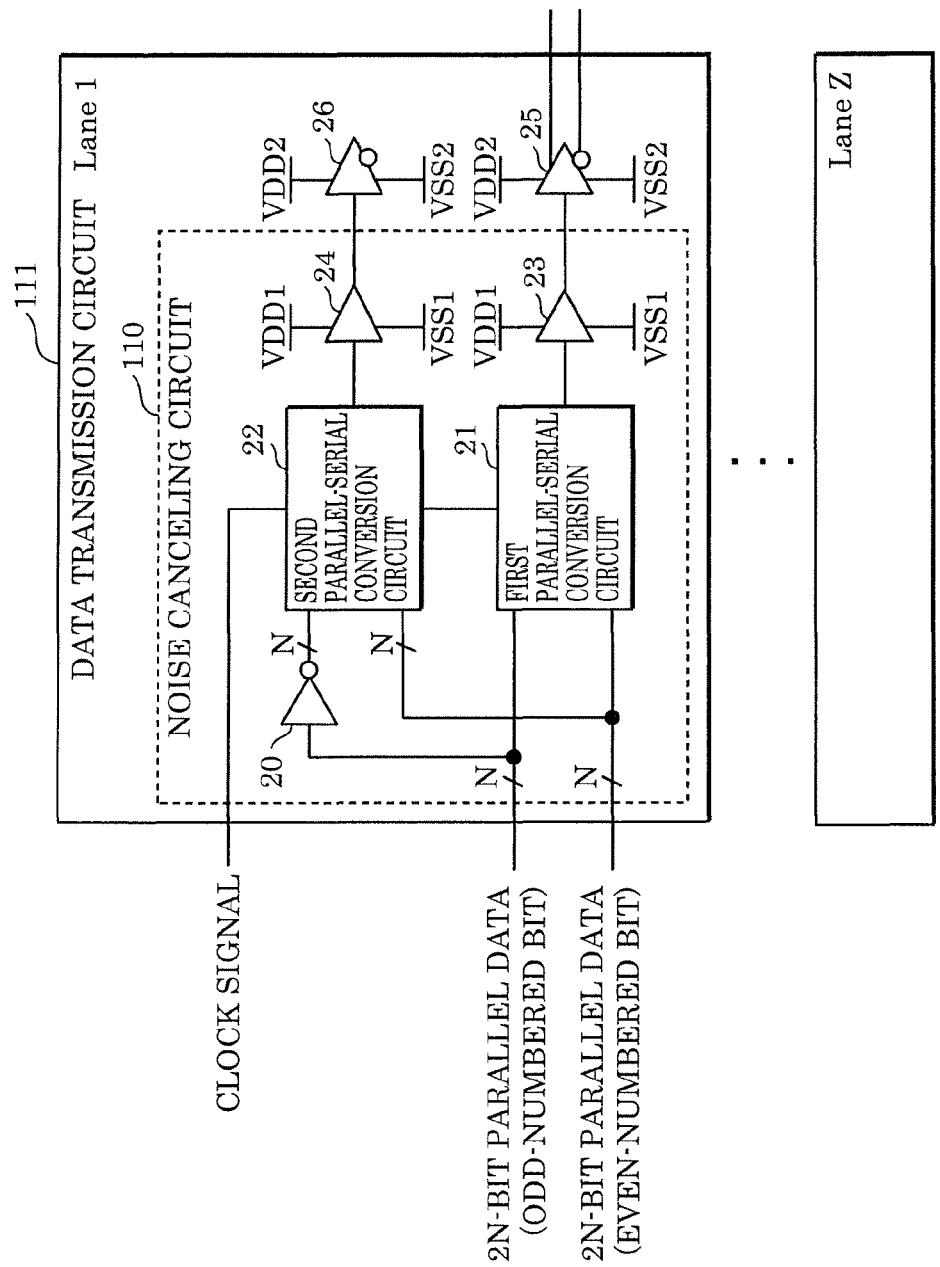
FIG. 1 is a diagram illustrating a configuration of a data transmission circuit according to Embodiment 1.

FIG. 1 is a diagram illustrating a configuration of data transmission circuit 111 including noise cancelling circuit 110 according to Embodiment 1. Note that data transmission circuits 111 with the same configuration are respectively provided in a plurality of lanes 1 to Z in the figure. Hereinafter, data transmission circuit 111 provided in the single lane will be described (the same applies to other embodiments). In addition, each data and signal are binary data and a binary signal unless otherwise is specified.

Data transmission circuit 111 includes noise cancelling circuit 110, third buffer 25, and fourth buffer 26. FIG. 1 illustrates 2N-bit parallel data inputted to data transmission circuit 111 and divided into N signal lines which transmit odd-numbered bits ("2N-bit parallel data (odd-numbered bits)") and N signal lines which transmit even-numbered bits ("2N-bit parallel data (even-numbered bits)").

Noise cancelling circuit 110 includes: first parallel-serial conversion circuit 21 which converts the inputted 2N-bit (where N is a natural number of 1 or more) parallel data into serial data in synchronization with a clock signal; inverting circuit 20 which inverts one of the odd-numbered bits and the even-numbered bits (the odd-numbered bits in the present embodiment) included in the inputted 2N-bit parallel data; second parallel-serial conversion circuit 22 which converts, into serial data in synchronization with the clock signal, parallel data outputted by inverting circuit 20 and the other one (the even-numbered bits in the present embodiment) of the odd-numbered bits and the even-numbered bits included in the inputted 2N-bit parallel data which were not inverted; first buffer 23 which receives output data of first parallel-serial conversion circuit 21; and second buffer 24 which receives output data of second parallel-serial conversion circuit 22.

In the same figure, first parallel-serial conversion circuit 21 and second parallel-serial conversion circuit 22 are formed using substantially the same kind of circuit. Here, "formed using substantially the same kind of circuit" means that a circuit configuration is provided such that substantially the same consumed current flows at the same timing, and first parallel-serial conversion circuit 21 and second parallel-serial conversion circuit 22 are typically connected to the same power source and the same ground and formed using the same kind of circuit.

The pieces of serial data already subjected to the parallel-serial conversion performed in first parallel-serial conversion circuit 21 and second parallel-serial conversion circuit 22 are respectively inputted to first buffer 23 and second buffer 24. First buffer 23 and second buffer 24 are connected to a common power source (here, a power source which supplies voltage VDD1) and connected to a common ground (here, a ground of voltage VSS1). A bypass capacitor (not illustrated) for smoothing the power source noise is connected between the power source and the ground.

Moreover, third buffer 25 is connected to an output terminal of first buffer 23 and similarly fourth buffer 26 is connected to an output terminal of second buffer 24 to provide the same load as the load of first buffer 23. Third buffer 25 and fourth buffer 26 are differential output buffers here. Third buffer 25 and fourth buffer 26 are both connected to a common power source (here, a power source which supplies voltage VDD2) and connected to a common ground (here, a ground of voltage VSS2). A bypass capacitor (not illustrated) for smoothing the power source noise is connected between the power source and the ground.

Note that the voltage (voltage VDD1 here) of the power source connected to first buffer 23 and second buffer 24 differs from the voltage (voltage VDD2 here) of the power source connected to third buffer 25 and fourth buffer 26 depending on specification. When the same supply voltage as the supply voltage of first buffer 23 and second buffer 24 may be supplied to third buffer 25 and fourth buffer 26, the power source and the ground connected to third buffer 25 and fourth buffer 26 are in common with the power source and the ground connected to first buffer 23 and second buffer 24. On the other hand, when a supply voltage different from the supply voltage of first buffer 23 and second buffer 24 needs to be supplied to third buffer 25 and fourth buffer 26, the different supply voltage from the supply voltage of first buffer 23 and second buffer 24 is supplied to third buffer 25 and fourth buffer 26.

An output signal of fourth buffer 26 is a signal which is not required in the actual transmission circuit and not outputted outside of the transmission circuit. That is, fourth buffer 26 is arranged as a dummy circuit. Third buffer 25 and fourth buffer 26 are formed using substantially the same kind of circuit. Specifically, as long as third buffer 25 and fourth buffer 26 have configurations such that substantially the same consumed currents flow at the same timing upon outputting data synchronous with the clock signal, third buffer 25 and fourth buffer 26 may be formed with identical circuit or different circuit configurations. Moreover, third buffer 25 and fourth buffer 26 are the differential output buffers in FIG. 1 but may be single-ended output buffers.

Figure 2:
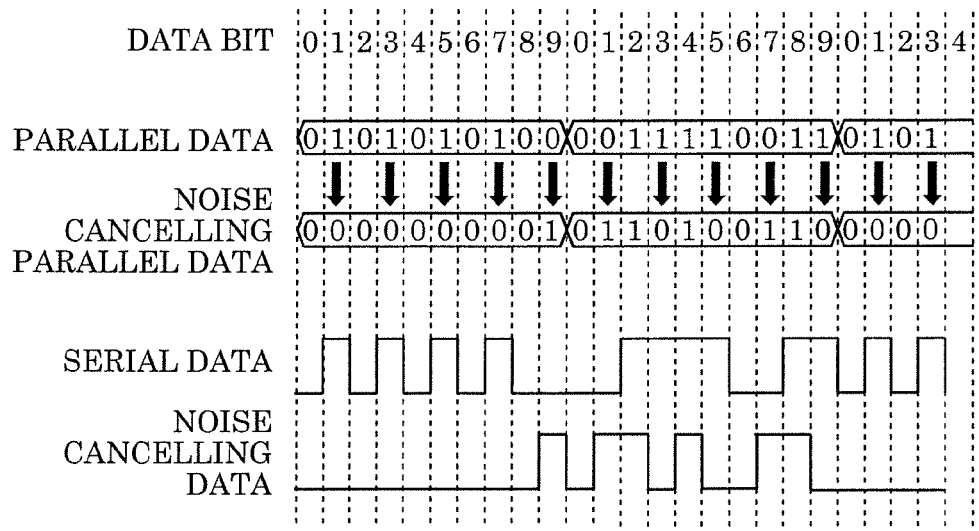
FIG. 2 is a timing diagram illustrating operation of the data transmission circuit according to Embodiment 1.

FIG. 2 is a timing diagram illustrating operation of data transmission circuit 111 according to Embodiment 1. In the figure, "DATA BIT" indicates data in which $0^{th}$ to $9^{th}$ bits as one word are repeated. "PARALLEL DATA" indicates 2N-bit parallel data inputted to data transmission circuit 111. "NOISE CANCELLING PARALLEL DATA" indicates parallel data combining together parallel data of the inverted odd-numbered bits, outputted by inverting circuit 20, and parallel data of the noninverted even-numbered bits with respect to the inputted 2N-bit parallel data, that is, data inputted to second parallel-serial conversion circuit 22. "SERIAL DATA" indicates the output data of first parallel-serial conversion circuit 21. "NOISE CANCELLING DATA" indicates the output data of second parallel-serial conversion circuit 22.

As can be understood from this figure, of the inputted 2N-bit parallel data, the odd-numbered bits are inverted at inverting circuit 20 while the even-numbered bits are not inverted. The parallel data combining together the inverted odd-numbered bits and the non-inverted even-numbered bits is subjected to parallel-serial conversion at second parallel-serial conversion circuit 22, whereby noise cancelling data (that is, a noise cancelling signal) is generated. The noise cancelling data is a serial signal in which data transition does not occur at a section where data transition (a change from 1 to 0, a change from 0 to 1) occurs on the serial data outputted from first parallel-serial conversion circuit 21 and data transition occurs at a section where no transition occurs on the serial data.

Such noise cancelling data is generated from parallel data with a data rate of Fc/2N[Hz] (that is, noise cancelling parallel data) without using serial data with a data rate of Fc[bps] after the parallel-serial conversion. Therefore, with data transmission circuit 111 including noise cancelling circuit 110 according to the present embodiment, noise cancelling data can be generated very easily without requiring the use of a high-speed clock signal and high-speed serial data in signal processing after the parallel-serial conversion as is the case with PTL 1. Note that the noise cancelling data may be generated not only by use of the inverted odd-numbered bits and the non-inverted even-numbered bits with respect to the inputted 2N-bit parallel data as in the present embodiment but may also be generated by use of inverted even-numbered bits and non-inverted odd-numbered bits.

Figure 3:
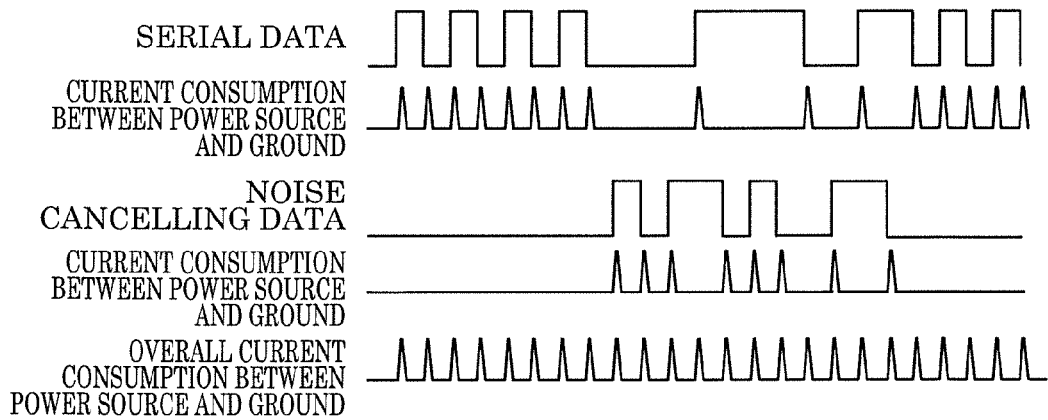
FIG. 3 is a schematic timing diagram illustrating relationship between noise cancelling data and a supply current in the data transmission circuit according to Embodiment 1.

FIG. 3 is a schematic timing diagram illustrating relationship between the noise cancelling data and the supply current in data transmission circuit 111 according to Embodiment 1. Note that "SERIAL DATA" in this figure indicates the "SERIAL DATA" of FIG. 2, that is, the output data of first parallel-serial conversion circuit 21. "CURRENT CONSUMPTION BETWEEN POWER SOURCE AND GROUND" below the "SERIAL DATA" indicates a current flowing between the power source and the ground in first buffer 23 and third buffer 25. "NOISE CANCELLING DATA" indicates the "NOISE CANCELLING DATA" of FIG. 2, that is, the output data of second parallel-serial conversion circuit 22. "CURRENT CONSUMPTION BETWEEN POWER SOURCE AND GROUND" below the "NOISE CANCELLING DATA" indicates a current flowing between the power source and the ground in second buffer 24 and fourth buffer 26. "OVERALL CURRENT CONSUMPTION BETWEEN POWER SOURCE AND GROUND" indicates an overall current flowing between the power source and the ground in first buffer 23, second buffer 24, third buffer 25, and fourth buffer 26. Operation and effects of noise cancelling circuit 110 will be described with reference to this figure.

As illustrated in the "CURRENT CONSUMPTION BETWEEN POWER SOURCE AND GROUND" at the second line from a top of FIG. 3, when data transmission circuit 111 outputs serial data in synchronization with a clock signal, an instantaneous current flows between the power source and the ground of first buffer 23 and third buffer 25 at a transition point thereof. When the output data does not change in synchronization with the clock signal, no instantaneous current flows between the power source and the ground of first buffer 23 and third buffer 25. On the other hand, as illustrated in the "CURRENT CONSUMPTION BETWEEN POWER SOURCE AND GROUND" at the fourth line from the top of FIG. 3, for second buffer 24 and fourth buffer 26 which receive the noise cancelling data, when the serial data transits in synchronization with the clock signal, the output does not transit, so that no instantaneous current flows between the power source and the ground of second buffer 24 and fourth buffer 26. When the serial data does not change in synchronization with the clock signal, noise cancelling circuit 110 outputs the noise cancelling data which has transited in synchronization with the clock signal, and an instantaneous current flows between the power source and the ground of second buffer 24 and fourth buffer 26.

First buffer 23 and second buffer 24 are connected to the common power source and connected to the common ground, and third buffer 25 and fourth buffer 26 are connected to the common power source and connected to the common ground. Thus, as illustrated in the "OVERALL CURRENT CONSUMPTION BETWEEN POWER SOURCE AND GROUND" of FIG. 3, an instantaneous current constantly flows between the power source and the ground at timing in synchronization with the clock signal without depending on the pattern of the serial data, which limits the frequency of the power source noise to a bandwidth dependent on the edge of the clock signal.

The resonance point of the power source impedance is usually designed to be several tens of MHz to several hundreds of MHz, and noise with a frequency higher than the resonance point is absorbed by the bypass capacitor connected between the power source and the ground in the circuit. When no noise cancelling circuit is provided, the power source noise depends on the pattern of the serial data, so that a frequency component of the power source noise ranges over a wide range from an edge cycle (data rate) of the clock signal to a frequency of 1/D (where D is an integer of 1 or more). Where the instantaneous current value is the same even at edge timing of any clock signal, a same level of instantaneous current noise is generated in the aforementioned frequency range, and larger power source noise is generated with a decrease in a distance from the resonance point frequency.

When noise cancelling circuit 110 according to the present disclosure is used, the instantaneous current noise is generated only in the edge cycle (data rate) of the clock signal, so that the instantaneous current noise is reliably absorbed by the bypass capacitor and the power source noise is hardly generated near the resonance point of the power source impedance, making it possible to more suppress the power source noise than when no noise cancelling circuit is provided.

As described above, noise cancelling circuit 110 according to the present embodiment includes: first parallel-serial conversion circuit 21 which converts the inputted 2N-bit (where N is a natural number of 1 or more) parallel data into serial data in synchronization with the clock signal; inverting circuit 20 which inverts one of the odd-numbered bits and the even-numbered bits of the inputted 2N-bit parallel data; second parallel-serial conversion circuit 22 which converts, into the serial data in synchronization with the clock signal, the parallel data outputted by inverting circuit 20 and the parallel data of the other one of the odd-numbered bits and the even-numbered bits included in the inputted 2N-bit parallel data which were not inverted; first buffer 23 which receives the output data of first parallel-serial conversion circuit 21; and second buffer 24 which receives the output data of second parallel-serial conversion circuit 22. First parallel-serial conversion circuit 21 and second parallel-serial conversion circuit 22 are formed using substantially the same kind of circuit, first buffer 23 and second buffer 24 are formed using substantially the same kind of circuit, and first buffer 23 and second buffer 24 are connected to the common power source and connected to the common ground.

Consequently, the noise cancelling data outputted from second parallel-serial conversion circuit 22 turns into the serial signal in which no data transition occurs at the section where the data transition occurs on the serial data outputted from first parallel-serial conversion circuit 21 and in which data transition occurs at the section where no data transition occurs on the serial data. Therefore, an instantaneous current flows at the section in first buffer 23 connected to the output of first parallel-serial conversion circuit 21 where the transition occurs on the serial data while an instantaneous current flows at the section in second buffer 24 connected to the output of second parallel-serial conversion circuit 22 where no transition occurs on the serial data. As a result, instantaneous current noise generated in noise cancelling circuit 110 is generated only in the edge cycle (data rate) of the clock signal and is thus reliably absorbed by the bypass capacitor connected between the power source and the ground.

Moreover, with noise cancelling circuit 110 according to the present embodiment, the noise cancelling data is not generated through the signal processing performed after the parallel-serial conversion as is the case with PTL 1 but the noise cancelling data is generated by use of the parallel data before the parallel-serial conversion. Therefore, use of a high-speed clock signal and high-speed serial data is not required, which makes it possible to much more easily generate the noise cancelling data than in a conventional case. That is, a noise cancelling circuit is realized which is capable of easily generating a noise cancelling signal even with a higher operation speed.

Moreover, the output terminal of second buffer 24 is connected with the same kind of load as the load of the output terminal of first buffer 23. Consequently, the current consumption at first buffer 23 and the current consumption at second buffer 24 become equal to each other, resulting in a constant current consumed in the noise cancelling circuit without depending on the inputted parallel data.

Moreover, noise cancelling circuit 110 includes a capacitor which is connected between the power source and the ground connected to first buffer 23 and second buffer 24 and which is provided for smoothing the power source noise. Consequently, the capacitor connected between the power source and the ground operates as a bypass capacitor, thus remarkably suppressing the instantaneous current noise in a fixed cycle generated in noise cancelling circuit 110.

Moreover, data transmission circuit 111 according to the present embodiment includes: noise cancelling circuit 110; third buffer 25 which is connected to the output terminal of first buffer 23 included in noise cancelling circuit 110 and which outputs a differential signal; and fourth buffer 26 which is connected to the output terminal of second buffer 24 included in noise cancelling circuit 110 and which is formed using substantially the same kind of circuit as the circuit of third buffer 25. Consequently, data transmission circuit 111 is realized which includes noise cancelling circuit 110 capable of easily generating a noise cancelling signal even with a higher operation speed.

Moreover, third buffer 25 and fourth buffer 26 are connected to the common power source and connected to the common ground. Consequently, instantaneous current noise in a fixed cycle generated between the power source and the ground in third buffer 25 and fourth buffer 26 is remarkably suppressed by the bypass capacitor connected between the power source and the ground.

Embodiment 2

A configuration such that the parallel-serial conversion circuits according to Embodiment 1 output multi-bit serial data will be described as Embodiment 2.

Figure 4:
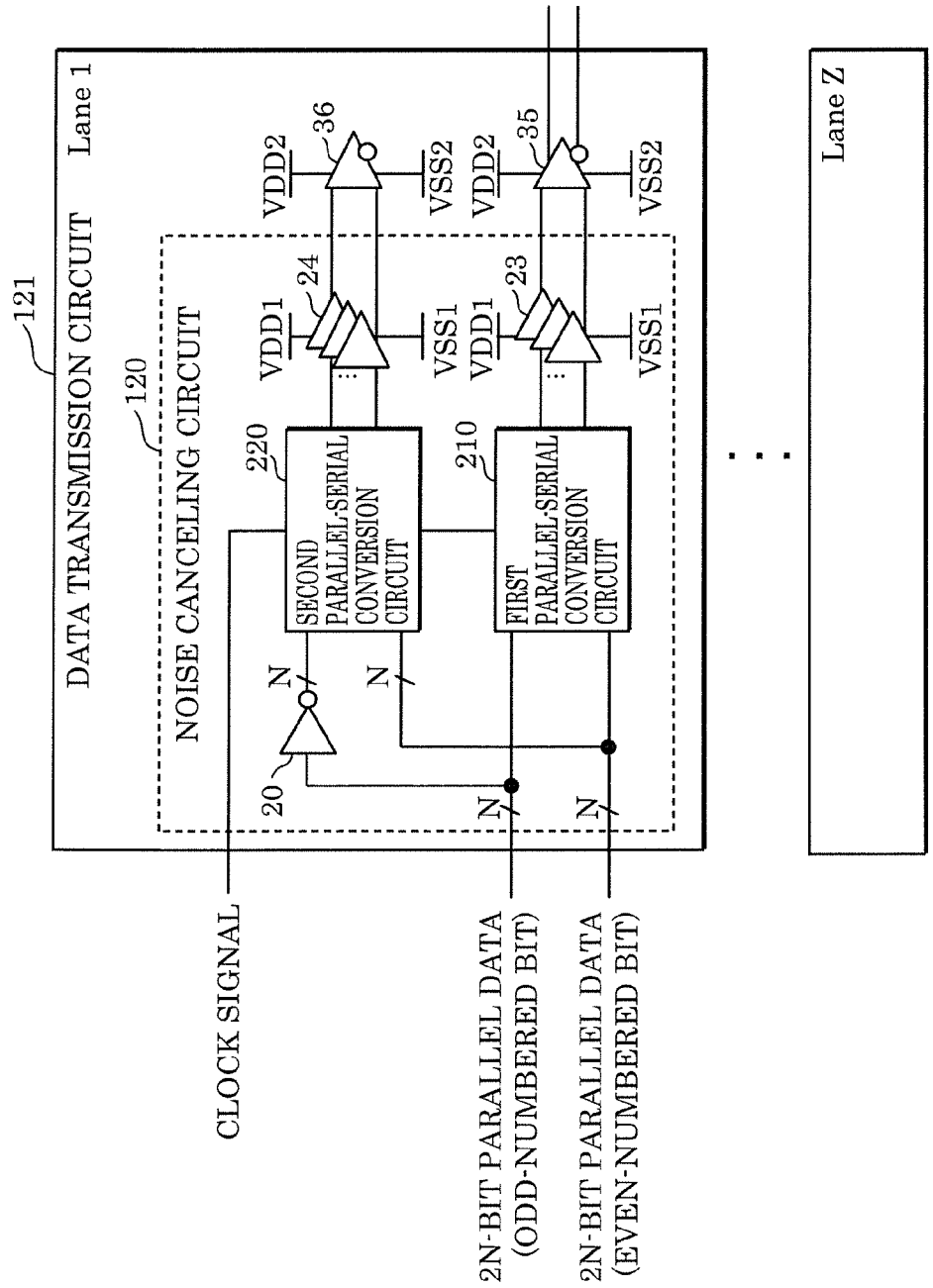
FIG. 4 is a diagram illustrating a configuration of a data transmission circuit according to Embodiment 2.

FIG. 4 is a diagram illustrating a configuration of data transmission circuit 121 including noise cancelling circuit 120 according to Embodiment 2. Data transmission circuit 121 includes a configuration such that first parallel-serial conversion circuit 21 and second parallel-serial conversion circuit 22 in data transmission circuit 111 according to Embodiment 1 are replaced with first parallel-serial conversion circuit 210 and second parallel-serial conversion circuit 220 each of which outputs multi-bit serial data, a plurality of communication sections 23 and a plurality of second buffers 24 are provided, and third buffer 25 and fourth buffer 26 are replaced with third buffer 35 and fourth buffer 36 each of which are provided for multi-bit input.

Each of first parallel-serial conversion circuit 210 and second parallel-serial conversion circuit 220 of FIG. 4 is a parallel-serial conversion circuit having the Y tap emphasis function of outputting Y-bit (where Y is a natural number of 2 or more) parallel-serial data from the 2N-bit parallel data.

In high-speed communication, a frequently varying bit contains high frequency components while a hardly varying bit contains less high frequency components, and thus a waveform of the higher-frequency component is more attenuated on a reception circuit side due to attenuation characteristics of a transmission path. Thus, the frequently varying bit has a smaller waveform than the hardly varying bit has. Thus, pre-emphasis and post-emphasis are performed as countermeasures for keeping the waveform received on the reception side constant. Thus, the parallel-serial conversion circuit which also generates an emphasis signal is included in the present embodiment as illustrated in FIG. 4. That is, first parallel-serial conversion circuit 210 and second parallel-serial conversion circuit 220 output, in addition to normal serial data, an emphasis signal (that is, emphasis serial data).

Figure 5:
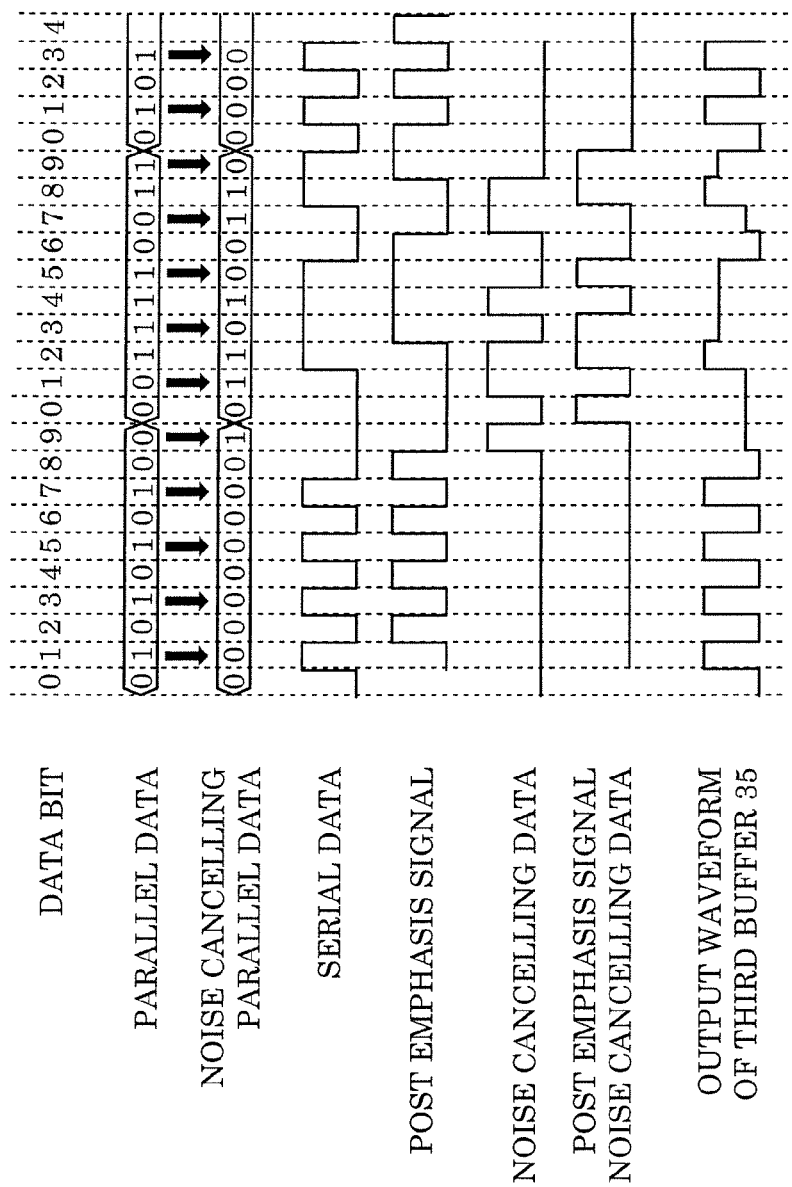
FIG. 5 is a timing diagram illustrating operation of the data transmission circuit according to Embodiment 2.

FIG. 5 is a timing diagram illustrating operation of data transmission circuit 121 according to Embodiment 2. The emphasis data outputted by first parallel-serial conversion circuit 210 and second parallel-serial conversion circuit 220 here is serial data which is delayed with respect to the serial data by one cycle (that is, corresponding to one clock). FIG. 5 illustrates a case where first parallel-serial conversion circuit 210 and second parallel-serial conversion circuit 220 operate as post-emphasis circuits where Y=2. That is, first parallel-serial conversion circuit 210 and second parallel-serial conversion circuit 220 each output 2-bit serial data. One of the two bits is serial data while the other bit is serial data which is delayed by one cycle of the data rate.

"DATA BIT" illustrated in FIG. 5 is data in which 0th to 9th bits as one word are repeated. "PARALLEL DATA" indicates 2N-bit parallel data inputted to data transmission circuit 121. "NOISE CANCELLING PARALEL DATA" indicates parallel data combining together parallel data of inverted odd-numbered bits, outputted by inverting circuit 20, and parallel data of non-inverted even-numbered bits with respect to the inputted 2N-bit parallel data, that is, data inputted to second parallel-serial conversion circuit 220. "SERIAL DATA" indicates one of pieces of output data of first parallel-serial conversion circuit 210. "POST EMPHASIS SIGNAL" indicates the other piece of the output data of first parallel-serial conversion circuit 210 and data which is obtained by delaying the noise cancelling data by one clock. "NOISE CANCELLING DATA" indicates one of pieces of output data of second parallel-serial conversion circuit 220. "POST EMPHASIS SIGNAL NOISE CANCELLING DATA" indicates the other piece of the output data of second parallel-serial conversion circuit 220 and data which is obtained by delaying the noise cancelling data by one clock. "OUTPUT WAVEFORM OF THIRD BUFFER 35" indicates the waveform of a signal outputted by third buffer 35.

Pieces of 2-bit serial data outputted from first parallel-serial conversion circuit 210 and second parallel-serial conversion circuit 220 are respectively inputted to first buffer 23 and second buffer 24 in 2-bit arrangement, and output signals from first buffer 23 and second buffer 24 are inputted to third buffer 35 and fourth buffer 36 as output buffers having the emphasis function. At this point, the output waveform of third buffer 35 turns into a waveform in which a signal for one cycle of the data rate is emphasized and continuous pieces of data for two or more cycles have signal intensity which relatively decreases, as illustrated in the "OUTPUT WAVEFORM OF THIRD BUFFER 35" of FIG. 5. Consequently, a favorable transmission signal for high-speed communication is generated in which the signal intensity of the high frequency component is more emphasized than the signal intensity of the low frequency component.

In case of the noise cancelling circuit disclosed in PTL 1, an increase in the output bit width of the parallel-serial conversion circuit requires the number of noise cancelling circuits corresponding to the aforementioned bit width, which in turn requires designing of a plurality of noise cancelling circuits which perform high-speed operation. On the contrary, according to the present embodiment, it is possible to easily generate noise cancelling data also corresponding to each emphasis signal without adding any noise cancelling circuit to first parallel-serial conversion circuit 210 and second parallel-serial conversion circuit 220 which output multi-bit emphasis serial data from the 2N-bit parallel data.

Embodiment 3

Here, a configuration such that the noise cancelling data generation according to Embodiment 1 is incorporated into a parallel-serial conversion circuit will be described as Embodiment 3.

Figure 6:
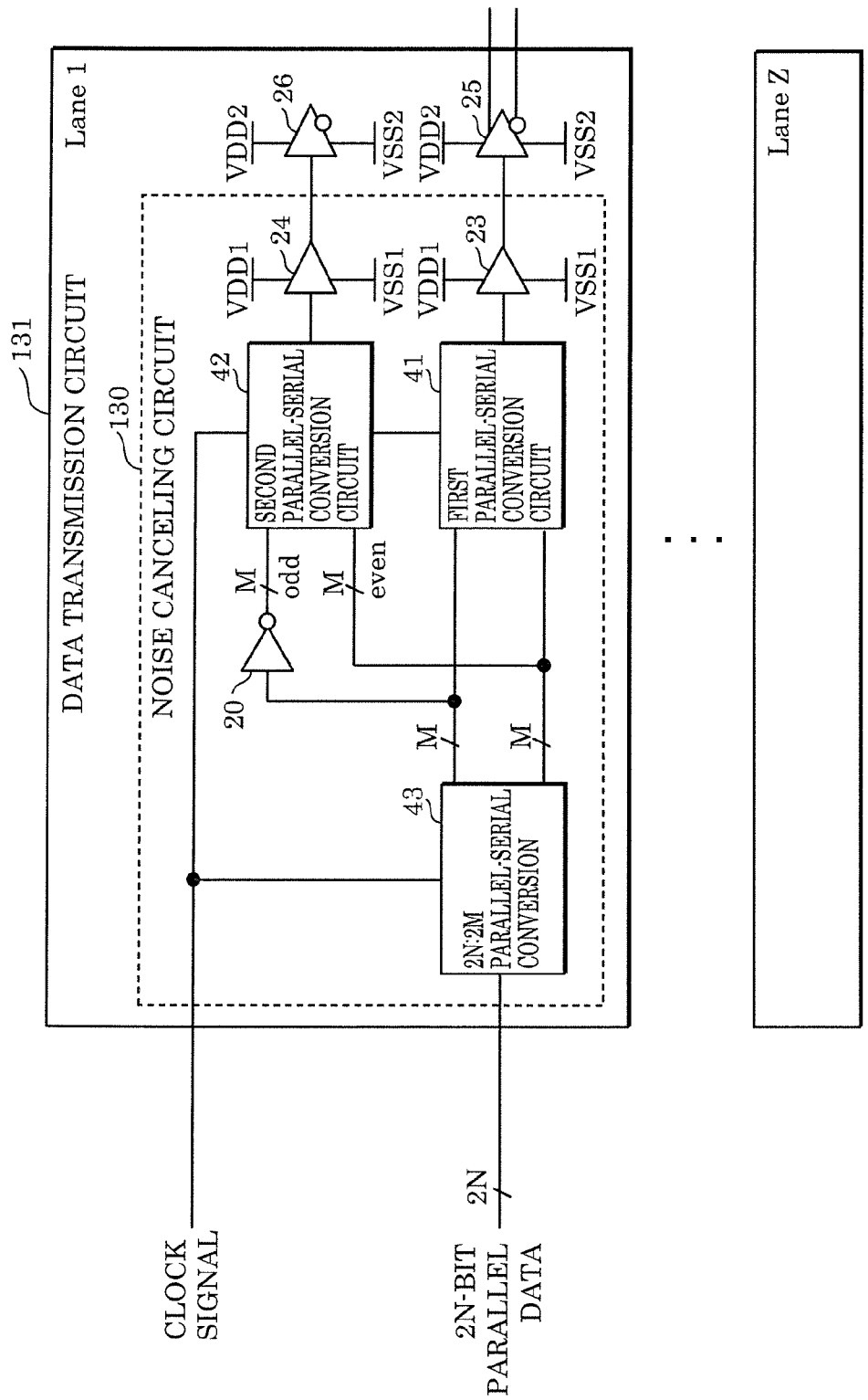
FIG. 6 is a diagram illustrating a configuration of a data transmission circuit according to Embodiment 3.

FIG. 6 is a diagram illustrating a configuration of data transmission circuit 131 including noise cancelling circuit 130 according to Embodiment 3. Data transmission circuit 131 includes a configuration such that first parallel-serial conversion circuit 21 and second parallel-serial conversion circuit 22 in data transmission circuit 111 according to Embodiment 1 are replaced with three parallel-serial conversion circuits (that is, 2N:2M parallel-serial conversion circuit 43, first parallel-serial conversion circuit 41, and second parallel-serial conversion circuit 42). Note that an expression "A: B" in the specification means that A-bit parallel data is converted into B-bit parallel data.

Specifically, noise cancelling circuit 130 includes: 2N:2M parallel-serial conversion circuit 43 which converts 2N-bit parallel data into 2M (where M is a natural number less than or equal to N)-bit parallel data (in other words, 2M-bit parallel-serial data where M is smaller than N); and first parallel-serial conversion circuit 41 and second parallel-serial conversion circuit 42 which convert the 2M-bit parallel data into 1-bit serial data.

According to the present embodiment, subjecting inverted odd-numbered bits and non-inverted even-numbered bits or non-inverted odd-numbered bits and inverted even-numbered bits of the 2N-bit parallel data to parallel-serial conversion performed by 2N:2M parallel-serial conversion circuit 43, inverting circuit 20, and second parallel-serial conversion circuit 42 makes it possible to generate noise cancelling data. At this point, the generation of the noise cancelling data is performed with Fc/2M[Hz] under the assumption that the data rate of the serial data outputted from first parallel-serial conversion circuit 41 is Fc[bps].

Figure 7:
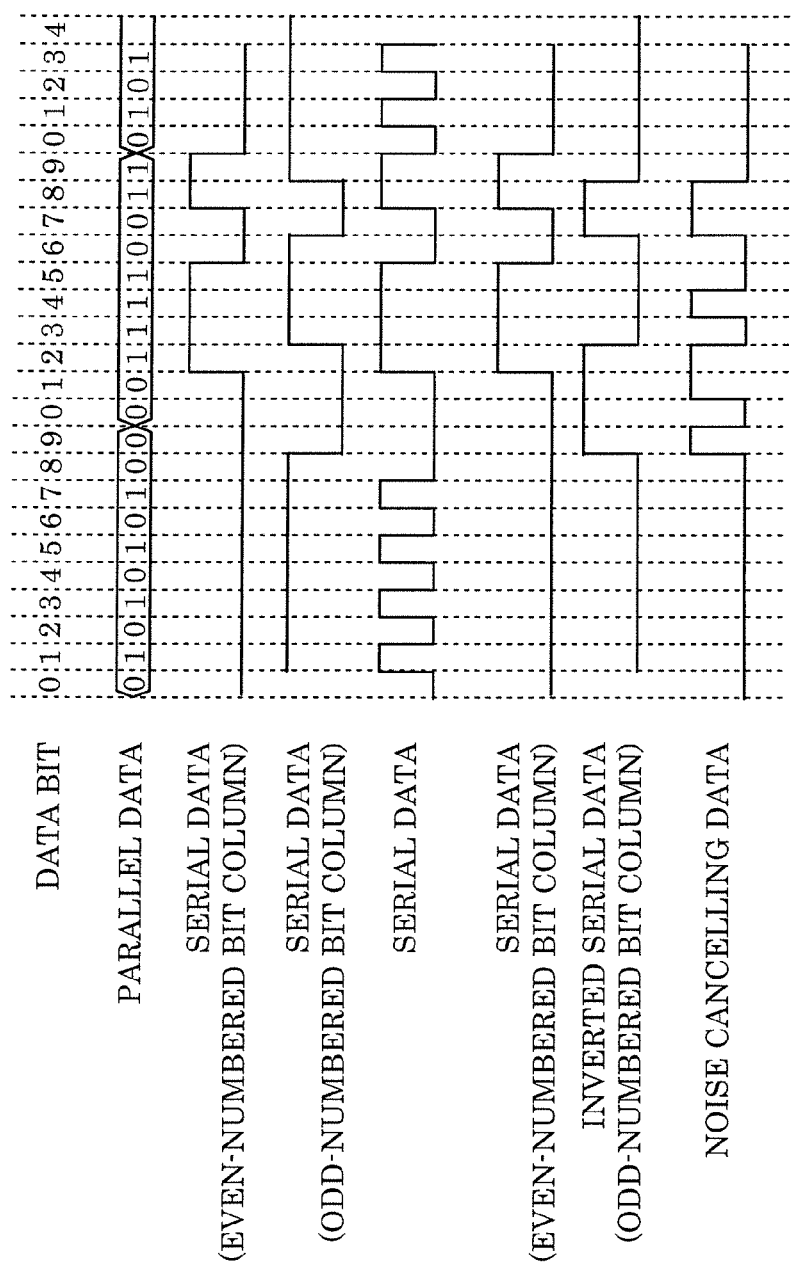
FIG. 7 is a timing diagram illustrating operation of the data transmission circuit according to Embodiment 3.

Referring to FIG. 7, the operation of data transmission circuit 131 where N=5 (that is, 2N is 10 bits) and M=1 (that is, 2M is 2 bits) will be described. FIG. 7 is a timing diagram illustrating the operation of data transmission circuit 131 according to Embodiment 3. "DATA BIT" in the figure, indicates data in which 0th to 9th bits as one word are repeated. "SERIAL DATA (EVEN-NUMBERED BIT COL- UMN)" indicates one piece of output data of the 2-bit output of 2N:2M parallel-serial conversion circuit 43. "SERIAL DATA (ODD-NUMBERED BIT COLUMN)" indicates the other piece of the output data of the 2-bit output of 2N:2M parallel-serial conversion circuit 43. "SERIAL DATA" indicates output data of first parallel-serial conversion circuit 41. "SERIAL DATA (EVEN-NUMBERED BIT COLUMN)" indicates one piece of the output data of the 2-bit output of 2N:2M parallel-serial conversion circuit 43. "INVERTED SERIAL DATA (ODD-NUMBERED BIT COLUMN)" indicates output data of inverting circuit 20. "NOISE CANCELLING DATA" indicates output data of second parallel-serial conversion circuit 42.

2N:2M parallel-serial conversion circuit 43 converts inputted 10-bit parallel data into 2-bit parallel data. At this point, pieces of the 2-bit parallel data include serial data of odd-numbered bits ("SERIAL DATA (ODD-NUMBERED BIT COLUMN" of FIG. 7) and serial data of even-numbered bits ("SERIAL DATA (EVEN-NUMBERED BIT COLUMN)" of FIG. 7) and have a frequency half of the data rate. Next, data obtained by inverting the serial data of the odd-numbered bits by inverting circuit 20 and the serial data of the non-inverted even-numbered bits are subjected to parallel-serial conversion at second parallel-serial conversion circuit 42, thereby making it possible to generate noise cancelling data ("NOISE CANCELLING DATA" of FIG. 7) as is the case with Embodiment 1.

Note that contrary to the present embodiment, even when inverted even-numbered bits and non-inverted odd-numbered bits with respect to the inputted 2N-bit parallel data are used, it is similarly possible to generate the noise cancelling data.

It is also possible to design N and M at desired values.

Moreover, the present embodiment has been described, referring to the parallel serial conversion circuit with two stages including 2N:2M and 2M:1. However, even with a configuration such that the parallel-serial conversion circuit is divided into several stages, it is possible to generate the noise cancelling data if one of pieces of data of the odd-numbered bits and the even-numbered bits of the 2N-bit parallel data can be inverted and the parallel data combined with the other non-inverted data can be subjected to parallel-serial conversion.

With the configuration of Embodiment 3, two circuits are required after the 2M:1 parallel-serial conversion circuit at a later stage while only one 2N:2M parallel-serial conversion circuit 43 at a former stage is required. Therefore, as is the case with the configuration of Embodiment 1, it is possible to more reduce a circuit area and the power consumption than in a case where two 2N:1 parallel-serial conversion circuits are required.

Embodiment 4

Next, a data transmission circuit which outputs a multi-level signal will be described as Embodiment 4.

Figure 8:
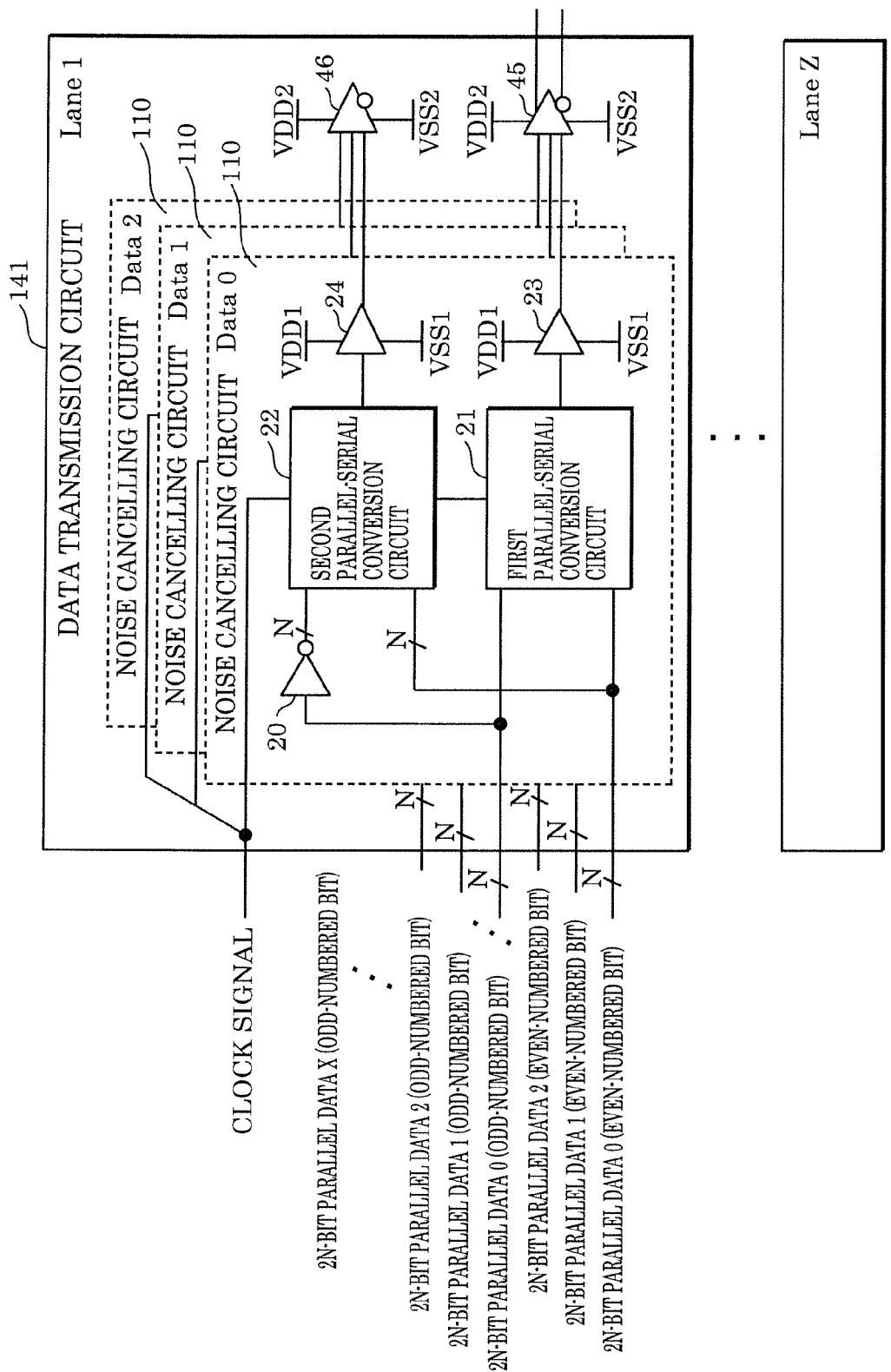
FIG. 8 is a diagram illustrating a configuration of a data transmission circuit according to Embodiment 4.

FIG. 8 is a diagram illustrating a configuration of data transmission circuit 141 according to Embodiment 4. Data transmission circuit 141 is capable of outputting a multilevel signal and includes: a plurality of (X here) noise cancelling circuits 110 according to Embodiment 1; and fifth buffer 45 and sixth buffer 46 which output a multilevel signal. Parallel data inputted to data transmission circuit 141 is 2N×X-bit (where X is a natural number of 2 or more) parallel data (2N-bit parallel data 0 to 2N-bit parallel data X).

M noise cancelling circuits 110 according to Embodiment 1 are arranged in parallel as noise cancelling circuits in the present embodiment. X-bit serial data (Data 0 to Data X) outputted from X noise cancelling circuits 110 are inputted to fifth buffer 45 serving as a multi-level differential output driver. That is, fifth buffer 45 is a differential output buffer which receives a plurality of pieces of serial data outputted from first parallel-serial conversion circuit 21 included in each of X noise cancelling circuits 110 and which outputs a multilevel signal.

Similarly, X-bit (Data 0 to Data X) noise cancelling data outputted from X noise cancelling circuits 110 are inputted to sixth buffer 46 serving as a dummy driver formed using substantially the same kind of circuit as the circuit of fifth buffer 45. That is, sixth buffer 46 is a differential output buffer which receives a plurality of pieces of serial data (that is, a plurality of pieces of noise cancelling data) outputted from second parallel-serial conversion circuit 22 included in each of X-noise cancelling circuits 110 and which outputs a multilevel signal.

Note that fifth buffer 45 and sixth buffer 46 are connected to a common power source and connected to a common ground. Fifth buffer 45 and sixth buffer 46 may be formed using substantially the same kind of circuit, for example, may be identical circuits, or may be different circuits if current consumptions at time of output data change in synchronization with the clock signal are substantially the same. Moreover, to bring the current consumption in fifth buffer 45 and the current consumption in sixth buffer 46 into agreement with each other, an output terminal of sixth buffer 46 may be connected with the same kind of load (that is, a load with the same impedance) as a load of an output terminal of fifth buffer 45.

As described above, data transmission circuit 141 according to the present embodiment includes: a plurality of noise cancelling circuits 110; fifth buffer 45 which receives a plurality of pieces of serial data outputted from first parallel-serial conversion circuit 21 included in each of the plurality of noise cancelling circuits 110 and which outputs a multi-level signal; and sixth buffer 46 which receives a plurality of pieces of serial data outputted from second parallel-serial conversion circuit 22 included in each of the plurality of noise cancelling circuits 110 and which outputs a multilevel signal. The output terminal of sixth buffer 46 is connected with the same kind of load as the load of the output terminal of fifth buffer 45.

Consequently, noise cancelling circuit 110 according to Embodiment 1 is applicable to a data transmission circuit which outputs a multilevel signal. Therefore, data transmission circuit 141 is realized which is capable of easily generating a noise cancelling signal even with a higher operation speed and which outputs a multilevel signal.

Embodiment 5

Next, a data transmission circuit combing together the characteristics of Embodiment 3 and the characteristics of Embodiment 4 will be described as Embodiment 5.

Figure 9:
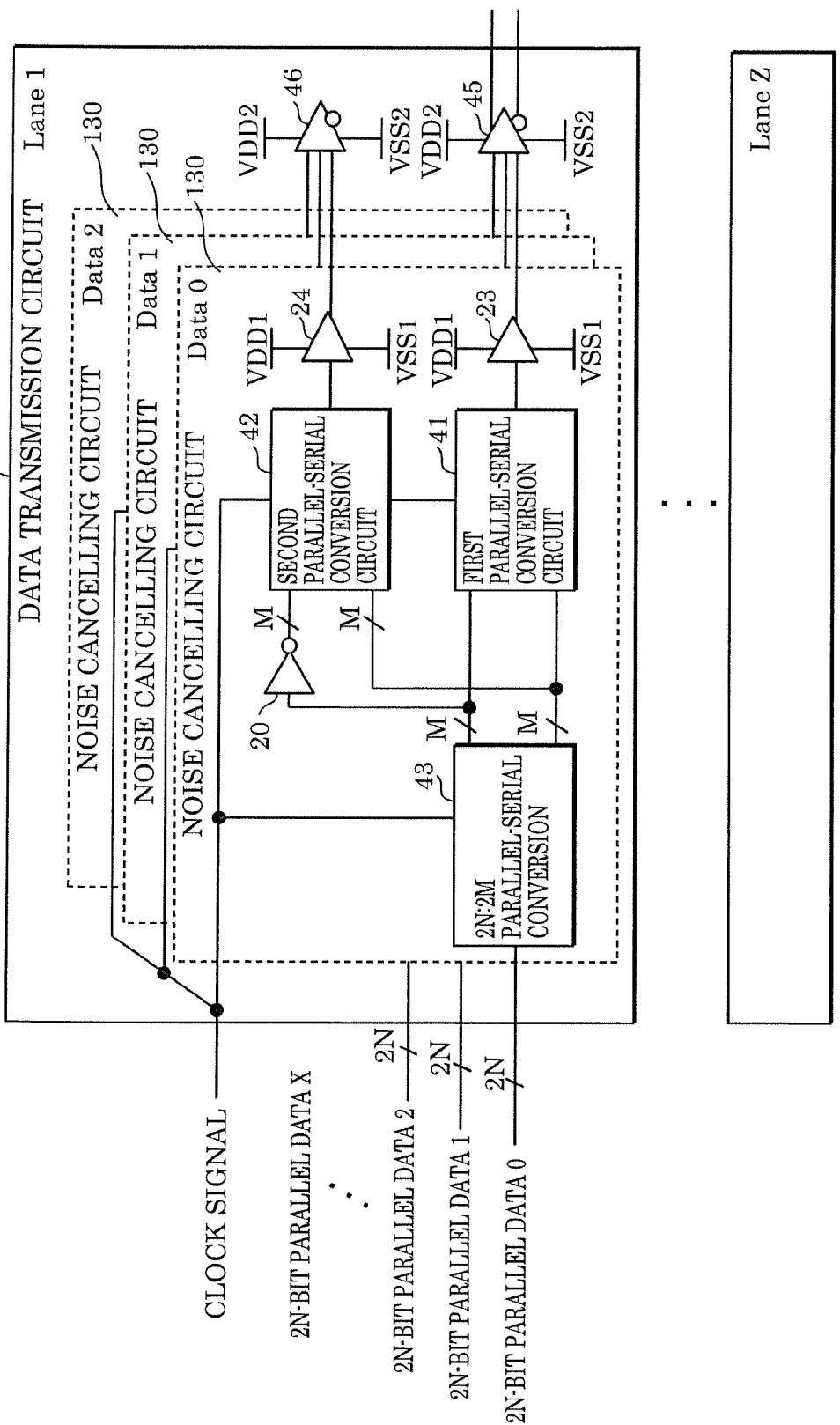
FIG. 9 is a diagram illustrating a configuration of a data transmission circuit according to Embodiment 5.

FIG. 9 is a diagram illustrating a configuration of data transmission circuit 151 according to Embodiment 5. Data transmission circuit 151 is capable of outputting a multilevel signal and includes a configuration such that X noise cancelling circuits 110 in data transmission circuit 141 according to Embodiment 4 are replaced with X noise cancelling circuits 130 according to Embodiment 3. Parallel data inputted to data transmission circuit 151 is 2N×X-bit (where N is a natural number of 2 or more) parallel data (2N-bit parallel data 0 to 2N-bit parallel data X).

X noise cancelling circuits 130 of Embodiment 3 are arranged in parallel as noise cancelling circuits in the present embodiment. X-bit serial data outputted from X noise cancelling circuits 130 is connected to fifth buffer 45 serving as a multilevel differential output driver. That is, fifth buffer 45 is a differential output buffer which receives a plurality of pieces of serial data outputted from first parallel-serial conversion circuit 41 included in each of X noise cancelling circuits 130 and which outputs a multilevel signal.

Similarly, X-bit noise cancelling data outputted from X noise cancelling circuits 130 is connected to sixth buffer 46 serving as a dummy driver which is formed using substantially the same kind of circuit as the circuit of fifth buffer 45. That is, sixth buffer 46 is a differential output buffer which receives a plurality of pieces of serial data (that is, a plurality of pieces of noise cancelling data) outputted from second parallel-serial conversion circuit 42 included in each of X noise cancelling circuits 130 and which outputs a multilevel signal.

Note that fifth buffer 45 and sixth buffer 46 are connected to a common power source and connected to a common ground. Fifth buffer 45 and sixth buffer 46 may be formed using substantially the same kind of circuit, for example, may be identical circuits, or may be different circuits if current consumptions are equal at time of output data change in synchronization with the clock signal. Moreover, to bring the current consumption in fifth buffer 45 and the current consumption in sixth buffer 46 into agreement with each other, an output terminal of sixth buffer 46 may be connected with the same kind of load as the load of an output terminal of fifth buffer 45 (that is, a load with the same impedance).

As described above, data transmission circuit 151 according to the present embodiment includes: a plurality of noise cancelling circuits 130; fifth buffer 45 which receives a plurality of pieces of serial data outputted from first parallel-serial conversion circuit 41 included in each of the plurality of noise cancelling circuits 130 and which outputs a multilevel signal; and sixth buffer 46 which receives a plurality of pieces of serial data outputted from second parallel-serial conversion circuit 42 included in each of the plurality of noise cancelling circuits 130 and which outputs a multilevel signal, and the output terminal of sixth buffer 46 is connected with the same kind of load as the load of the output terminal of fifth buffer 45.

Consequently, noise cancelling circuit 130 according to Embodiment 3 is applicable to a data transmission circuit which outputs a multilevel signal. Therefore, data transmission circuit 151 is realized which is capable of easily generating a noise cancelling signal even with a higher operation speed and which outputs a multilevel signal.

Embodiment 6

Next, a data transmission circuit including a noise cancelling circuit which generates a noise cancelling signal even when inputted parallel data is odd-numbered bits will be described as Embodiment 6.

FIG. 10A is a diagram illustrating a configuration of data transmission circuit 161 including noise cancelling circuit 160 according to Embodiment 6. Data transmission circuit 161 includes noise cancelling circuit 160, third buffer 25, and fourth buffer 26. Note that data transmission circuit 161 receives N-bit (where N is an odd number of 1 or more) parallel data in the present embodiment.

Noise cancelling circuit 160 includes: first parallel-serial conversion circuit 61 which converts N-bit (where N is an odd number of 1 or more) parallel data into serial data in synchronization with a clock signal; selector section 60 which receives the N-bit parallel data and which outputs parallel data by alternately switching in an update cycle of the N-bit parallel data between a mode in which inverted odd-numbered bits and non-inverted even-numbered bits with respect to the inputted N-bit parallel data are outputted and a mode in which non-inverted odd-numbered bits and inverted even-numbered bits with respect to the inputted N-bit parallel data are outputted; second parallel-serial conversion circuit 62 which converts the parallel data outputted by selector section 60 into serial data in synchronization with the clock signal; first buffer 23 which receives output data of first parallel-serial conversion circuit 61; and second buffer 24 which receives output data of second parallel-serial conversion circuit 62. First parallel-serial conversion circuit 61 and second parallel-serial conversion circuit 62 are formed using substantially the same kind of circuit. First buffer 23 and second buffer 24 are formed using substantially the same kind of circuit. First buffer 23 and second buffer 24 are connected to a common power source (here, a power source which supplies voltage VDD1) and connected to a common ground (here, a ground of voltage VSS1).

First buffer 23 is connected with third buffer 25, and output of second buffer 24 is similarly connected with fourth buffer 26 to provide a load equal to the load of first buffer 23. Third buffer 25 and fourth buffer 26 are differential output buffers here. Third buffer 25 and fourth buffer 26 are connected to a common power source (here, a power source which supplies voltage VDD2) and connected to a common ground (here, a ground of voltage VSS2).

Figure 10B:
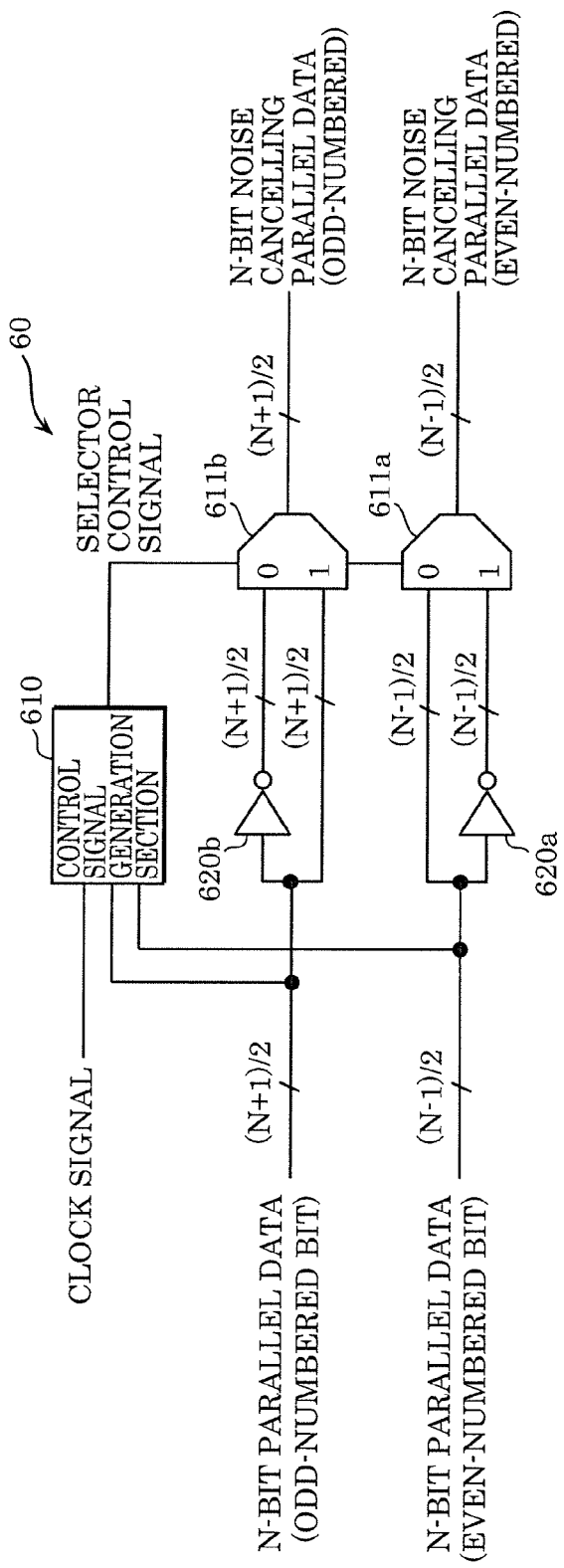
FIG. 10B is a diagram illustrating one example of a detailed configuration of a selector section of Embodiment 6.

FIG. 10B is a diagram illustrating one example of a detailed configuration of selector section 60 of Embodiment 6. Selector section 60 includes: control signal generation section 610, inverting circuits 620a and 620b, and selector circuits 611a and 611b.

Control signal generation section 610 generates a selector control signal in which an N-cycle Low (L) signal and an N-cycle high (H) signal alternately change based on a clock signal. At this point, control signal generation section 610 detects that the N-bit parallel data has been updated and makes adjustment to bring parallel data update timing and selector control signal change timing into agreement with each other.

Inverting circuit 620a inverts even-numbered bits of the N-bit parallel data. On the other hand, inverting circuit 620b inverts odd-numbered bits of the N-bit parallel data.

Selector circuit 611a selects the even-numbered bits of the N-bit parallel data when the selector control signal is in an L period and selects output data from inverting circuit 620a, that is, the parallel data obtained by inverting the even-numbered bits of the N-bit parallel data when the selector control signal is in an H period, and outputs the selected N-bit parallel data as N-bit noise cancelling parallel data (even numbered).

Selector circuit 611b selects output data from inverting circuit 620b, that is, parallel data obtained by inverting the odd-numbered bits of the N-bit parallel data when the selector control signal is in an L period and selects the odd-numbered bits of the N-bit parallel data when the selector control signal is in an H period, and outputs the selected N-bit parallel data as N-bit noise cancelling parallel data (odd numbered).

Therefore, the N-bit noise cancelling parallel data outputted from selector section 60 (that is, the output data from selector circuit 611a and selector circuit 611b) is parallel data obtained by inverting the odd-numbered bits of the inputted N-bit parallel data when the selector control signal is in an L period and parallel data obtained by inverting the even-numbered bits of the inputted N-bit parallel data when the selector control signal is in an H period.

Figure 11A:
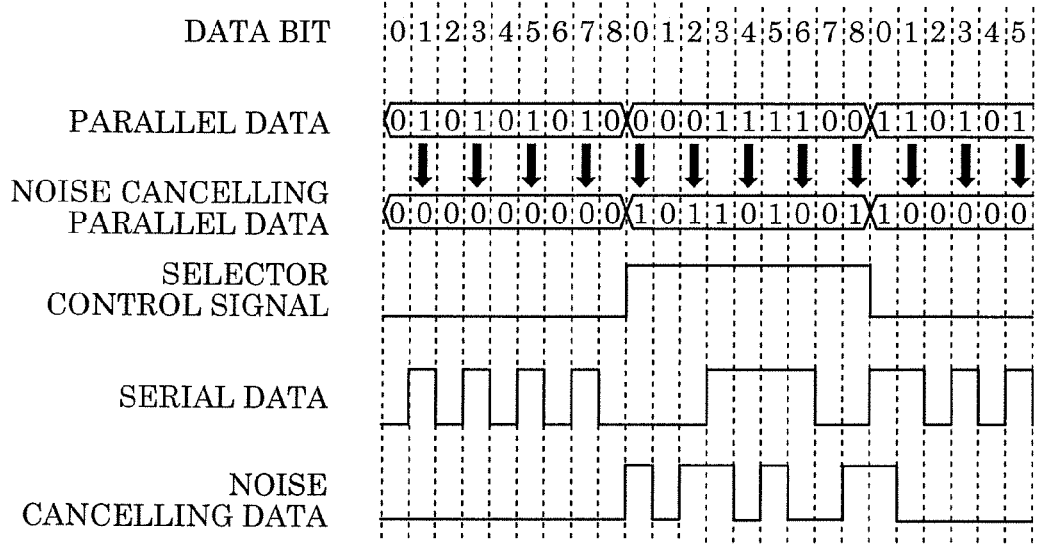
FIG. 11A is a timing diagram illustrating one example of operation of the data transmission circuit according to Embodiment 6.
Figure 11B:
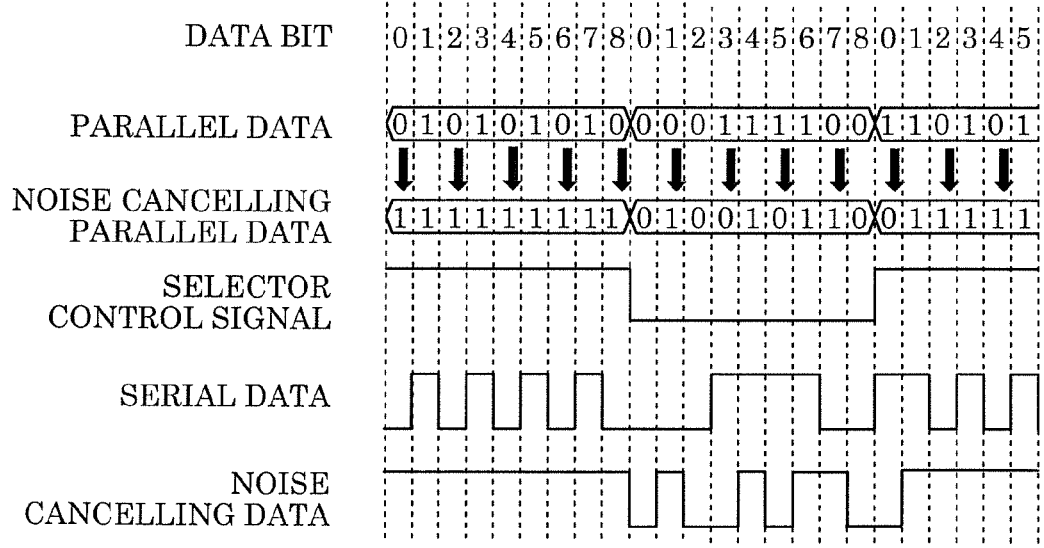
FIG. 11B is a timing diagram illustrating another example of the operation of the data transmission circuit according to Embodiment 6.

Phase relationship of the selector control signal and phase relationship of the parallel data update timing are found in FIGS. 11A and 11B. FIG. 11A is a timing diagram illustrating one example of operation of data transmission circuit 161 according to Embodiment 6. FIG. 11B is a timing diagram illustrating another example of the operation of data transmission circuit 161 according to Embodiment 6. "DATA BIT" in FIGS. 11A and 11B indicates data in which 0th to eighth bits as one word are repeated. "PARALLEL DATA" indicates N-bit parallel data inputted to data transmission circuit 161. "NOISE CANCELLING PARALLEL DATA" indicates parallel data outputted by selector section 60, that is, data inputted to second parallel-serial conversion circuit 62. "SELECTOR CONTROL SIGNAL" indicates a selector control signal outputted by control signal generation section 610. "SERIAL DATA" indicates output data of first parallel-serial conversion circuit 61. "NOISE CANCELLING DATA" indicates output data of second parallel-serial conversion circuit 62.

As can be understood from FIGS. 11A and 11B, non-inverted noise cancelling data with respect to the serial data is outputted in FIG. 11A and inverted noise cancelling data is outputted in FIG. 11B. When the instantaneous currents flowing between the power source and the ground are equal in both a rise edge and a fall edge in first buffer 23 and second buffer 24 connected to a later stage of noise cancelling circuit 160, noise cancelling circuit 160 can be provided which works in the same manner as in Embodiment 1 as a result of a change of noise cancelling data when the serial data does not change without depending on the direction of the edge. Moreover, even if first buffer 23 and second buffer 24 connected to the later stage are differential output buffers, first buffer 23 and second buffer 24 function as noise cancelling circuits as is the case with the present embodiment.

As described above, noise cancelling circuit 160 according to the present embodiment includes: first parallel-serial conversion circuit 61 which converts N-bit (where N is an odd number of 1 or more) parallel data into serial data in synchronization with a clock signal; selector section 60 which receives the N-bit parallel data and which outputs parallel data by alternately switching in the update cycle of the N-bit parallel data between the mode in which the inverted odd-numbered bits and the non-inverted even-numbered bits with respect to the inputted N-bit parallel data are outputted and the mode in which the non-inverted odd-numbered bits and the inverted even-numbered bits with respect to the inputted N-bit parallel data are outputted; second parallel-serial conversion circuit 62 which converts the parallel data outputted by selector section 60 into serial data in synchronization with the clock signal; first buffer 23 which receives the output data of first parallel-serial conversion circuit 61; and second buffer 24 which receives the output data of second parallel-serial conversion circuit 62. First parallel-serial conversion circuit 61 and second parallel-serial conversion circuit 62 are formed using substantially the same kind of circuit. First buffer 23 and second buffer 24 are formed using substantially the same kind of circuit. First buffer 23 and second buffer 24 are connected to the common power source (here, the power source which supplies voltage VDD1) and connected to the common ground (here, the ground of voltage VSS1).

Consequently, as is the case with Embodiment 1, instantaneous current noise is generated in noise cancelling circuit 160 only in an edge cycle (data rate) of the clock signal and is thus reliably absorbed by the bypass capacitor connected between the power source and the ground. Moreover, noise cancelling data can be much more easily generated than in a conventional case without requiring the use of a high-speed clock signal and high-speed serial data. Therefore, according to the present embodiment, data transmission circuit 161 is realized which includes noise cancelling circuit 160 capable of easily generating the noise cancelling signal even with a higher operation speed where the N-bit (where N is an odd number of 1 or more) parallel data is provided as input.

Embodiment 7

Next, a data transmission circuit combining the characteristics of Embodiment 3 and the characteristics of Embodiment 6 will be described as Embodiment 7.

Figure 12:
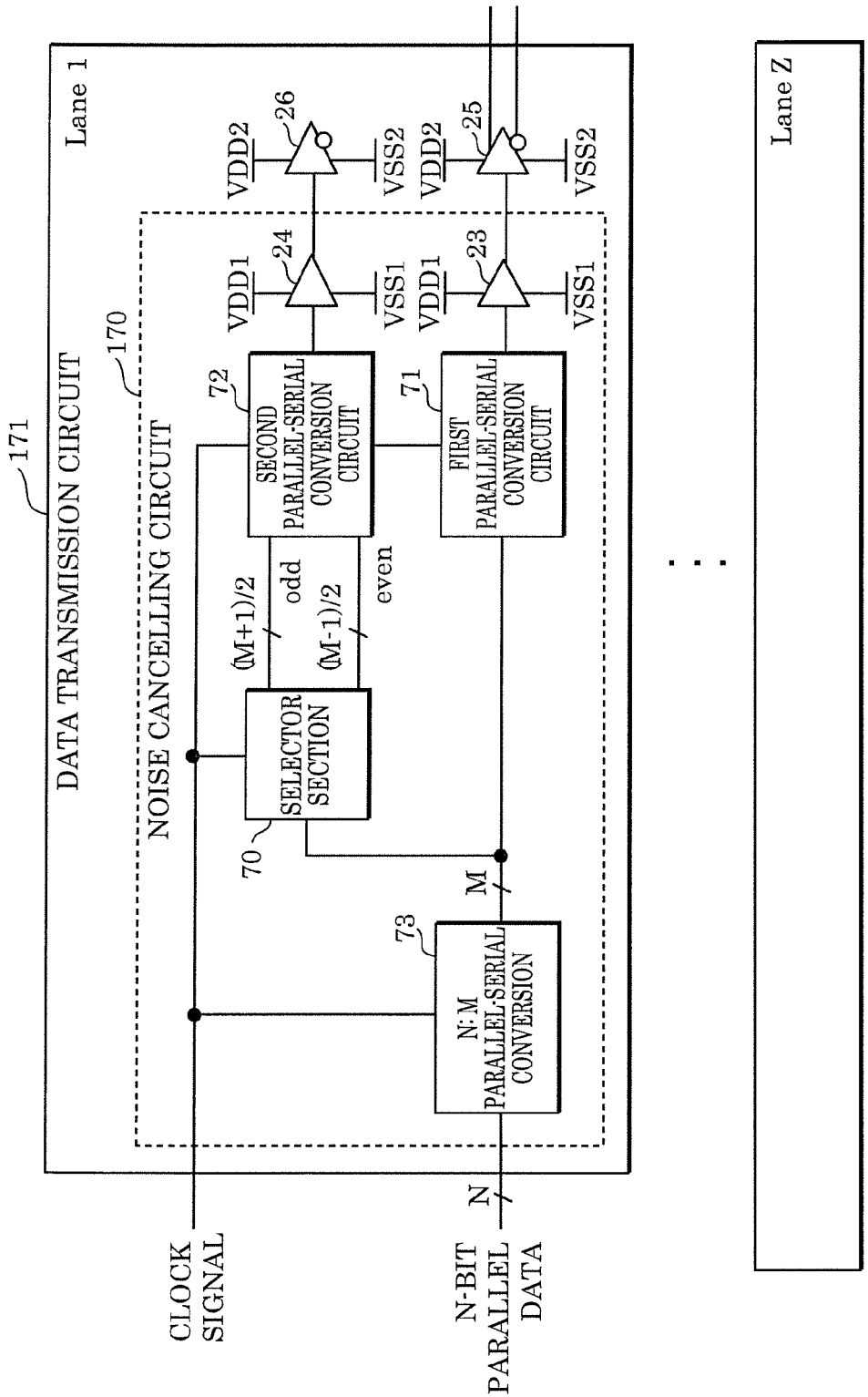
FIG. 12 is a diagram illustrating a configuration of a data transmission circuit according to Embodiment 7.

FIG. 12 is a diagram illustrating a configuration of data transmission circuit 171 according to Embodiment 7. Data transmission circuit 171 includes a configuration such that selector section 60, first parallel-serial conversion circuit 61, and second parallel-serial conversion circuit 62 in data transmission circuit 161 according to Embodiment 6 are replaced with selector section 70, N:M parallel-serial conversion circuit 73, first parallel-serial conversion circuit 71, and second parallel-serial conversion circuit 72.

N:M parallel-serial conversion circuit 73 converts N-bit parallel data into M-bit (where M is a natural number less than or equal to N) parallel data (that is, M-bit parallel-serial data when M is smaller than N).

Selector section 70 receives the M-bit parallel data and outputs parallel data by alternately switching in an update cycle of the M-bit parallel data between a mode in which inverted odd-numbered bits and non-inverted even-numbered bits with respect to the inputted M-bit parallel data are outputted and a mode in which non-inverted odd-numbered bits and inverted even-numbered bits with respect to the inputted M-bit parallel data are outputted.

First parallel-serial conversion circuit 71 and second parallel-serial conversion circuit 72 each convert the M-bit parallel data into 1-bit serial data.

Noise cancelling circuit 170 of data transmission circuit 171 according to the present embodiment configured as described above receives, as input, the N-bit (where N is an odd number of 1 or more) parallel data. N:M parallel-serial conversion circuit 73 outputs the converted M-bit parallel data to selector section 70 which generates noise cancelling parallel data and first parallel-serial conversion circuit 71 which performs parallel-serial conversion to output serial data. The noise cancelling parallel data outputted from selector section 70 is outputted to second parallel-serial conversion circuit 72 which is formed using substantially the same kind of circuit as a circuit of first parallel-serial conversion circuit 71.

As described above, according to the present embodiment, as is the case with Embodiment 6, data transmission circuit 171 is realized which includes noise cancelling circuit 170 capable of easily generating a noise cancelling signal even with a higher operation speed where N-bit (where N is an odd number of 1 or more) parallel data is provided as input.

Note that the operation frequency of selector section 70 in data transmission circuit 171 according to the present embodiment is n/m times as high as the operation frequency in Embodiment 6, but only one N:M parallel-serial conversion at a former stage in M:1 parallel-serial conversion is required, making it possible to reduce a circuit area and power consumption.

The noise cancelling circuits and the data transmission circuits according to the present disclosure have been described above, referring to Embodiments 1 to 7, although the disclosure is not limited to Embodiments 1 to 7. Various modifications made to any of Embodiments 1 to 7 which can be conceived of by those skilled in the art and another embodiment formed by combining together part of the components in Embodiments 1 to 7 are also included in the scope of the disclosure without departing from the spirits of the disclosure.

For example, in Embodiment 3 and Embodiment 7, the parallel-serial conversion is divided into the two stages and the circuit which generates noise cancelling data is provided between the two stages of the parallel-serial conversion, but the disclosure is not limited to this. A parallel-serial conversion circuit in actual design may be designed with S stages (where S is a natural number of 1 or more), and a circuit which generates noise cancelling data may be configured to be connected to any one section from the first stage to the stage before the S-th stage of the s-stage parallel-serial conversion circuit. The number of stages of the parallel-serial conversion circuit and a connection place of the circuit which generates noise cancelling data may be determined in view of balance between an operation frequency, a circuit area, and power consumption.

Moreover, in the embodiments described above, the first buffer and the second buffer are circuits separated from the first parallel-serial conversion circuit and the second parallel-serial conversion circuit arranged in front of the first buffer and the second buffer as well as the third buffer and the fourth buffer arranged behind the first buffer and the second buffer, although the disclosure is not limited to this configuration. The first buffer and the second buffer may be respectively incorporated (that is, as an output stage) into the first parallel-serial conversion circuit and the second parallel-serial conversion circuit or may be incorporated (that is, as an input stage) into the third buffer and the fourth buffer.

INDUSTRIAL APPLICABILITY

A noise cancelling circuit according to the present disclosure is usable not only for a data transmission circuit but also for a data conversion circuit including a parallel-serial conversion circuit.

What is claimed is:

1. A noise cancelling circuit, comprising:
a first parallel-serial conversion circuit which converts 2N-bit parallel data into serial data in synchronization with a clock signal, where N is a natural number of 1 or more;
an inverting circuit which inverts one of odd-numbered bits and even-numbered bits included in the 2N-bit parallel data;
a second parallel-serial conversion circuit which converts, into serial data in synchronization with the clock signal, parallel data outputted by the inverting circuit and parallel data of the other one of the odd-numbered bits and the even-numbered bits included in the 2N-bit parallel data which were not inverted;
a first buffer which receives output data of the first parallel-serial conversion circuit; and
a second buffer which receives output data of the second parallel-serial conversion circuit, wherein the first parallel-serial conversion circuit and the second parallel-serial conversion circuit are formed using substantially a same kind of circuit,
the first buffer and the second buffer are formed using substantially a same kind of circuit, and
the first buffer and the second buffer are connected to a common power source and connected to a common ground.

2. The noise cancelling circuit according to claim 1, wherein
an output terminal of the second buffer is connected with a same kind of load as a load of an output terminal of the first buffer.

3. The noise cancelling circuit according to claim 1, further comprising
a capacitor for smoothing power source noise, the capacitor being connected between the common power source and the common ground connected to the first buffer and the second buffer.

4. A data transmission circuit, comprising:
the noise cancelling circuit according to claim 1;
a third buffer connected to an output terminal of the first buffer included in the noise cancelling circuit, the third buffer outputting a differential signal; and
a fourth buffer connected to an output terminal of the second buffer included in the noise cancelling circuit, the fourth buffer being formed using substantially a same kind of circuit as a circuit of the third buffer.

5. The data transmission circuit according to claim 4, wherein
the third buffer and the fourth buffer are connected to a common power source and connected to a common ground.

6. A data transmission circuit, comprising:
a plurality of noise cancelling circuits each serving as the noise cancelling circuit according to claim 1;
a fifth buffer which receives a plurality of pieces of serial data outputted from the first parallel-serial conversion circuits respectively included in the plurality of noise cancelling circuits, the fifth buffer outputting a multilevel signal; and
a sixth buffer which receives a plurality of pieces of serial data outputted from the second parallel-serial conversion circuits respectively included in the plurality of noise cancelling circuits, the sixth buffer outputting a multilevel signal, wherein
an output terminal of the sixth buffer is connected with a same kind of load as a load of an output terminal of the fifth buffer.

7. A noise cancelling circuit, comprising:
a first parallel-serial conversion circuit which converts N-bit parallel data into serial data in synchronization with a clock signal, where N is an odd number of 1 or more;
a selector section which receives the N-bit parallel data and which outputs parallel data by alternately switching in an update cycle of the N-bit parallel data between a mode in which inverted odd-numbered bits and non-inverted even-numbered bits with respect to the inputted N-bit parallel data are outputted and a mode in which non-inverted odd-numbered bits and inverted even-numbered bits with respect to the inputted N-bit parallel data are outputted;
a second parallel-serial conversion circuit which converts the parallel data outputted by the selector section into serial data in synchronization with the clock signal;

a first buffer which receives output data of the first parallel-serial conversion circuit; and a second buffer which receives output data of the second parallel-serial conversion circuit, wherein the first parallel-serial conversion circuit and the second parallel-serial conversion circuit are formed using substantially a same kind of circuit, the first buffer and the second buffer are formed using substantially a same kind of circuit, and the first buffer and the second buffer are connected to a common power source and connected to a common ground.

8. The noise cancelling circuit according to claim 7, wherein an output terminal of the second buffer is connected with a same kind of load as a load of an output terminal of the first buffer.

9. The noise cancelling circuit according to claim 7, further comprising a capacitor for smoothing power source noise, the capacitor being connected between the common power source and the common ground connected to the first buffer and the second buffer.

10. A data transmission circuit, comprising:

the noise cancelling circuit according to claim 7;

a third buffer connected to an output terminal of the first buffer included in the noise cancelling circuit, the third buffer outputting a differential signal; and a fourth buffer connected to an output terminal of the second buffer included in the noise cancelling circuit, the fourth buffer being formed using substantially a same kind of circuit as a circuit of the third buffer.

11. The data transmission circuit according to claim 10, wherein the third buffer and the fourth buffer are connected to a common power source and connected to a common ground.

12. A data transmission circuit, comprising:

a plurality of noise cancelling circuits each serving as the noise cancelling circuit according to claim 7;

a fifth buffer which receives a plurality of pieces of serial data outputted from the first parallel-serial conversion circuits respectively included in the plurality of noise cancelling circuits, the fifth buffer outputting a multilevel signal; and a sixth buffer which receives a plurality of pieces of serial data outputted from the second parallel-serial conversion circuits respectively included in the plurality of noise cancelling circuits, the sixth buffer outputting a multilevel signal, wherein an output terminal of the sixth buffer is connected with a same kind of load as a load of an output terminal of the fifth buffer.

* * * * *